United States Patent
Katano et al.

[11] Patent Number: 5,842,544
[45] Date of Patent: Dec. 1, 1998

[54] APPARATUS FOR HOUSING PRINTED CIRCUIT BOARD

[75] Inventors: Ryoichiro Katano; Taira Ishii, both of Kofu, Japan

[73] Assignee: Matsushita Electric Industrial Co., Ltd., Japan

[21] Appl. No.: 814,725

[22] Filed: Mar. 7, 1997

[30] Foreign Application Priority Data

Mar. 14, 1996 [JP] Japan .................................. 8-057376

[51] Int. Cl.⁶ .................................................. B66B 9/04
[52] U.S. Cl. ........................................ 187/277; 187/414
[58] Field of Search .................................. 187/414, 213, 187/250, 240, 244, 272, 274, 275, 391, 397

[56] References Cited

U.S. PATENT DOCUMENTS 5,690,315  11/1997  Thomas .................................. 187/272
5,718,307  2/1998  Diekwisch .............................. 187/274

Primary Examiner—Kenneth Noland
Attorney, Agent, or Firm—Parkhurst & Wendel

[57] ABSTRACT

An object of the present invention, which is a printed circuit board housing apparatus, is to allow the state of the printed circuit boards inside a rack (fully loaded or in mid-process, or the like) to be determined at a glance from outside the rack, so as to ensure that printed circuit boards are controlled in each rack. To achieve this object, the printed circuit board housing apparatus pertaining to the present invention comprises a display mark on the exterior component of the rack side plates for displaying the state of the printed circuit boards inside the rack, and a shutter for switching the display of the display mark, as well as a drive component for sliding the shutter.

4 Claims, 5 Drawing Sheets

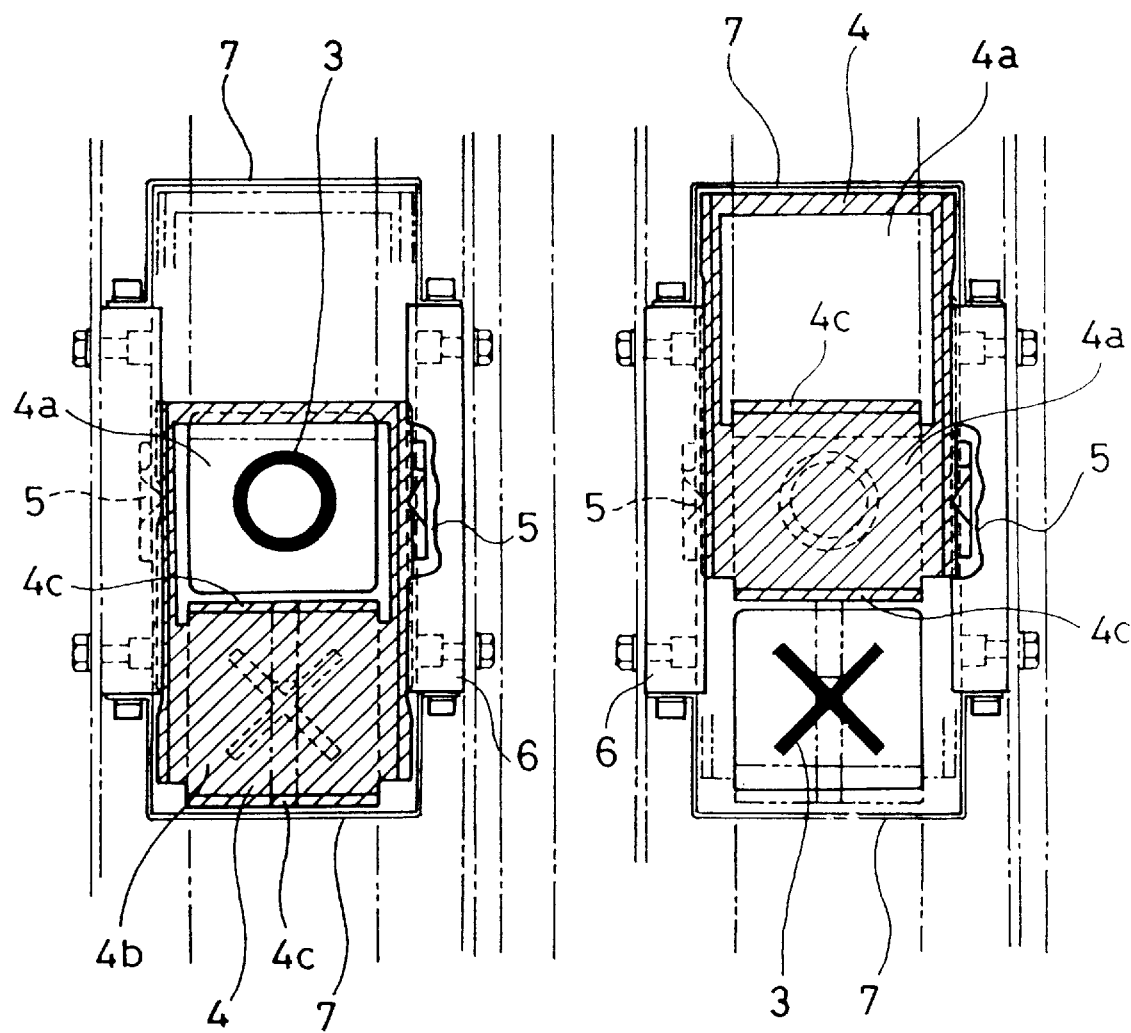

APPARATUS FOR HOUSING PRINTED CIRCUIT BOARD

BACKGROUND OF THE INVENTION

1. Field of the Invention

The present invention relates to an apparatus for housing printed circuit boards, comprising a means for automatically housing printed circuit boards in racks and displaying the condition of the printed circuit boards during a process for automatically loading printed circuit boards constituting electronic circuits.

2. Description of Related Art

There have been recent developments in the automation and rationalization of devices for loading electronic components. Such developments have led to the need for an apparatus to manage the racks in printed circuit board housing apparatuses which are set up on line behind the loading device.

A conventional apparatus for housing printed circuit boards is described below with reference to FIG. 5.

In FIG. 5, 31 is a printed circuit board housing apparatus that is used to house printed circuit boards, and 32 is a rack located on the aforementioned printed circuit board housing apparatus 31. A pair of side plates 33 in which concave components 34 have been formed for supporting the ends of printed circuit boards 35 is located on both side walls of the rack 32. 36 is a lifter component that fixes the racks 32 and lifts or lowers them according to the pitch of the concave components 34 or a value several times the pitch. 37 is an ascending conveyor that conveys the racks 32 in sequence to the lifter component 36. 38 is a descending conveyor that sequentially conveys racks 32 housing printed circuit boards 35 which have been conveyed from the aforementioned lifter component 36.

The operation of the printed circuit board housing apparatus thus constructed is described below.

Empty racks 32 which have been conveyed by the ascending conveyor 37 are fixed to the lifter component 36 in the printed circuit board housing apparatus 31. Printed circuit boards 35, which have been conveyed from a previous process, are pushed by a pushing component (not shown in figure) in the previous process into an empty rack 32, where they are housed. The empty racks 32 fixed on the lifter component 36 are sequentially lowered at a set pitch so as to sequentially house the printed circuit boards 35.

When the rack is filled with printed circuit boards 35, the rack 32 which is fixed on a lifter component 37 is conveyed to the descending conveyor 38. The lifter component 36 then rises to the position at the ascending conveyor 37 to house other empty racks 32.

The aforementioned operations are repeated in sequence, so that printed circuit boards 35 are housed in the racks 32.

The printed circuit boards 35 are managed by each rack 32 in which the printed circuit boards 35 are housed.

However, the following drawbacks occur in the aforementioned conventional structure.

First, the printed circuit boards in the racks are difficult to see, making it difficult to distinguish whether the printed circuit boards are fully loaded or are still in mid-process. It is thus difficult to manage racks into which printed circuit boards have been placed.

Second, because the printed circuit board housing apparatus set up on line behind the reflow soldering device (not shown) houses printed circuit boards with a particularly high temperature directly in the racks, the concave components in the side plates supporting the printed circuit boards in the racks are deformed by the circuit boards, and there are problems in that the printed circuit boards fall off or become stuck.

SUMMARY OF THE INVENTION

The present invention, which solves the aforementioned drawbacks of the prior art, allows the state of the printed circuit boards in the racks (fully loaded or in mid-process) or the like to be determined at a glance from outside the rack, thereby facilitating rack management. In addition, the invention is intended to provide a printed circuit board housing apparatus, in which the concave components in the side plates supporting the printed circuit boards in the racks can be prevented from becoming deformed, so that the printed circuit boards will not fall or become stuck.

To achieve this object, the printed circuit board housing apparatus in claim 1 pertaining to the present invention is equipped with a rack having a pair of side plates with concave components to support printed circuit boards, a lifter component that fixes said rack to lift it at a set pitch so as to house printed circuit boards in the rack, and ascending and descending conveyor components for conveying said rack in a set direction, comprising a display mark on the exterior component of said rack side plates for displaying the state of the printed circuit boards inside the rack, and a shutter for switching the display of said display mark, as well as a drive component for sliding said shutter to the top of the bottom conveyor.

The aforementioned structure in the present invention allows the state of the printed circuit boards inside a rack (fully loaded or in mid-process, or the like) to be determined at a glance from outside the rack, so as to ensure that printed circuit boards are managed in each rack.

In the invention in claim 2, the drive component further comprises a pair each of cylinders and levers, said shutter being operated via the levers by the operation of the cylinders. The aforementioned structure has the effect of switching the display mark by the selective operation of the pair of cylinders.

The invention in claim 3 further comprises a spring for positioning the shutter, and a guide to prevent the shutter from jumping. The spring positions the shutter when the shutter is being switched. The jump-preventing guide has the function of preventing the shutter from jumping.

The invention in claim 4 further comprises a fan at the lifter component for cooling the interior of the lifter component and for cooling the printed circuit boards. The printed circuit boards are cooled to prevent deformation of the concave components in the side plates supporting the printed circuit boards inside the rack, allowing the printed circuit boards to be prevented from falling of or becoming stuck.

BRIEF DESCRIPTION OF THE DRAWINGS

FIGS. 4(A) and 4(B) is a schematic of the rack display component, 4(A) being of a state in which the rack displays O, and FIG. 4(B) being of a state in which the rack displays X; and FIG. 5(A) is a plan of a conventional printed circuit board housing apparatus, while

DESCRIPTION OF THE PREFERRED EMBODIMENTS

Preferred embodiments of the present invention are described below with reference to FIGS. 1A–4B.

Preferred Embodiment 1

Figure 1A:
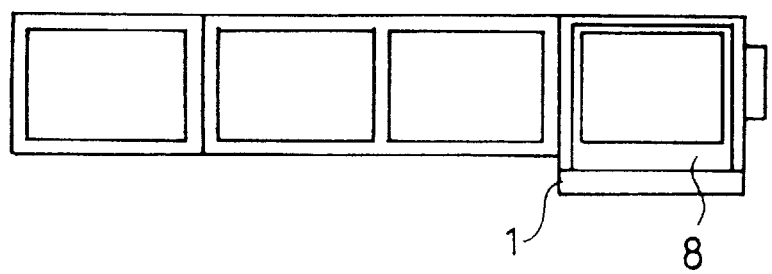
FIG. 1(A) is a plan of the printed circuit board housing apparatus in a preferred embodiment of the present invention.
Figure 1B:
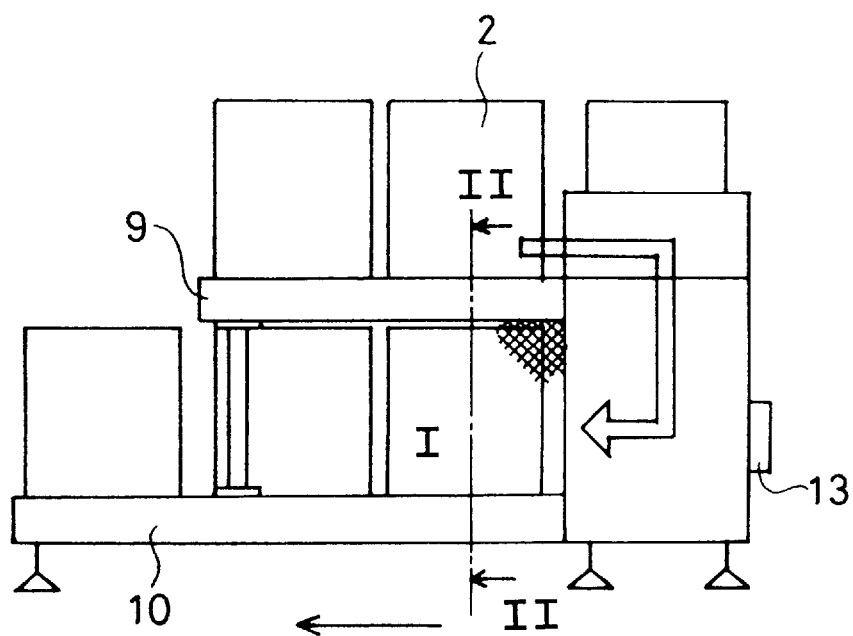
FIG. 1(B) is a front view.
Figure 2:
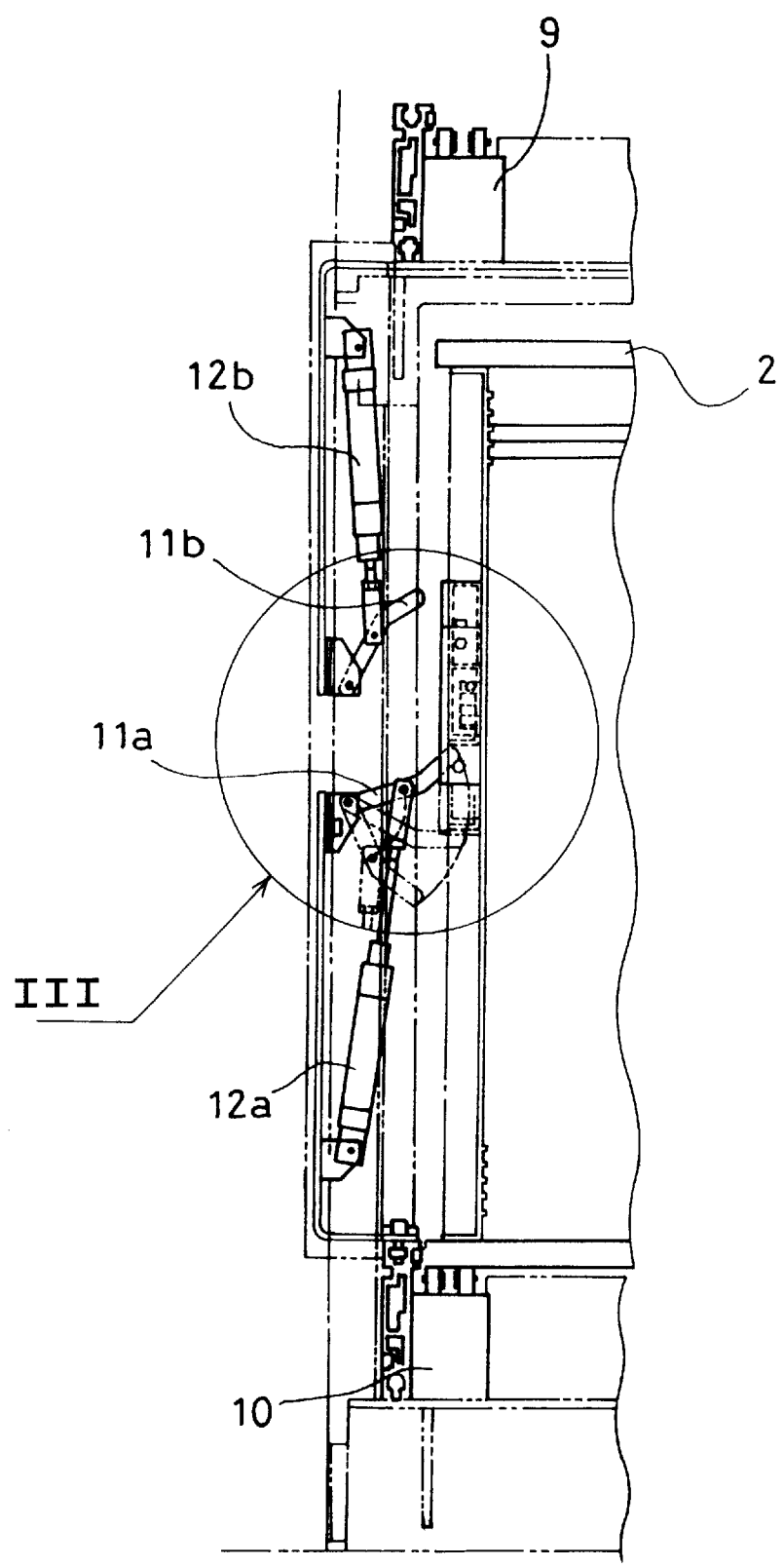
FIG. 2 is a cross section of II—II in FIG. 1B.
Figure 3:
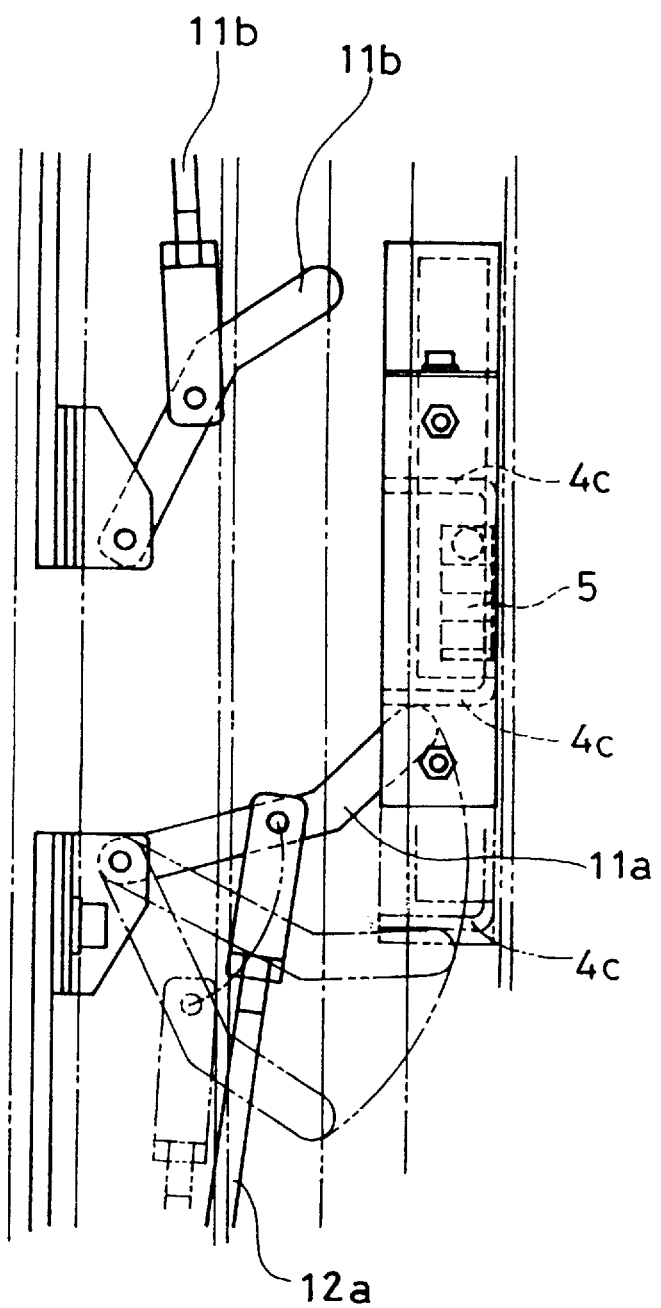
FIG. 3 is a detail of part III in FIG. 2.
Figure 5A:
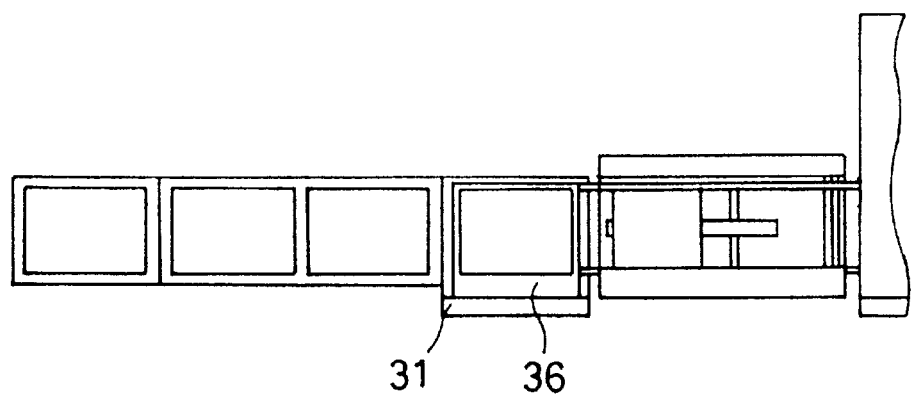
Figure 5B:
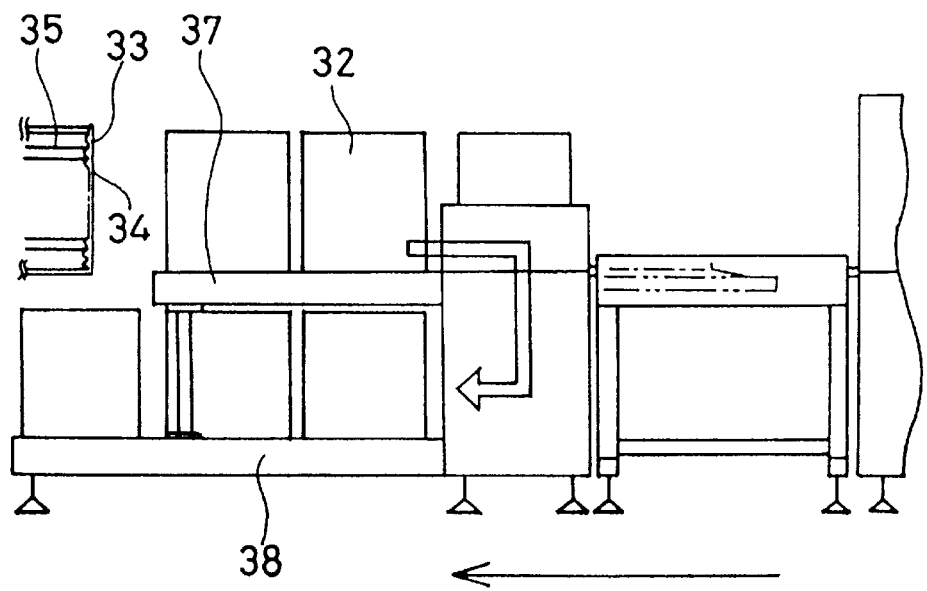
FIG. 5(B) is a front view.

FIGS. 1A and 1B are a plan and front view, respectively, of the printed circuit board housing apparatus pertaining to the present invention; FIG. 2 is a cross section of II—II in FIG. 1; FIG. 3 is a partial detail of FIG. 2; and FIGS. 4(a) and (b) are schematics of states in which the rack displays O and X, respectively.

In the figures, 1 is a circuit board housing apparatus main unit, 2 is a rack having concave components supporting the ends of printed circuit boards, 3 is a display mark provided on the exterior of the side plates of the aforementioned rack 2, 4 is a shutter for switching the display in the aforementioned display mark, 5 is a spring that is attached to the side of the aforementioned shutter 4 and that is used to position the shutter, 6 is a lock slidably attaching the shutter 4 to the side plates of the aforementioned rack 2, 7 is a guide to prevent the shutter 4 from jumping, 8 is a lifter component that fixes the aforementioned rack 2 to lift it at a set pitch, 9 is an ascending conveyor, 10 is a descending conveyor, 11a and b are levers for switching the display of the aforementioned rack 2, and 12a and b are cylinders serving as drive components for the aforementioned levers 11a and b.

The aforementioned shutter 4 has an opening 4a formed on one side of a rectangular plate, with the other side serving as a shield component 4b shielding the display mark 3. Standing pieces 4c and 4c are located at both ends of the shield component 4b. The standing pieces 4c and 4c are pressed by the levers 11a and b, so that the shutter 4 slides up and down. When the shutter 4 slides up and down, the display mark 3 located in the opening 4a is visible from the outside, while the display mark 3 located behind the shield component 4b is not visible.

The aforementioned levers 11a and b are bent inward in the middle, and are supported by hinges at set intervals in the center of the wall between the ascending and descending conveyors 9 and 10. The tips of the cylinders 12a and b are attached to the centers of the levers 11a and b.

The operation of the printed circuit board housing apparatus constructed in the aforementioned manner is described below.

An empty rack 2 conveyed by the ascending conveyor 9 is fixed onto a lifter component 8 in the printed circuit board housing apparatus 1. The printed circuit boards conveyed from a previous process are housed in the empty rack 2 by a pushing component (not shown in figure) located in a device in the previous process. The empty rack 2 fixed onto the lifter component 8 is sequentially lowered at a set pitch so as to sequentially house printed circuit boards in the empty rack 2.

The empty rack 2 is sequentially lowered, and when the rack 2 is filled with printed circuit boards, the rack 2 fixed onto the lifter component 8 is conveyed from the lifter component 8 to the descending conveyor 10. The lifter component 8 is then lifted to the position at the ascending conveyor 9 to house an empty rack 2.

When the rack 2 housing the printed circuit boards reaches position A on the descending conveyor 10 depicted in FIG. 1(B), one of the cylinders 12a or b is operated to switch the display of the display mark 3 located on the rack 2, as shown in FIG. 2. One of the cylinders 12a or b is operated, so as to move the lever 11a or b either up or down, as shown in FIG. 3. The shutter 4 is positioned by the spring 5 located to the left and right of the lock 6, and the display mark 3 is displayed for each rack 2.

FIGS. 4A and 4B depicts the rack 2 display switching component, FIG. 4(A) being of a case in which the cylinder 12b has been driven, and FIG. 4(B) being of a case in which the cylinder 12a has been driven.

A rack 2 in which the display mark 3 has been completely switched to the position I in FIG. 1(B) is conveyed by the descending conveyor 10 from the printed circuit board housing apparatus 1, and is managed at each display mark 3.

The aforementioned operations are repeated sequentially to house printed circuit boards. The printed circuit board housing apparatus pertaining to the present invention allows the state of the printed circuit boards inside the rack (fully loaded or still in mid-process) or the like to be determined at a glance from the outside of the rack, thereby ensuring that each rack is managed.

Preferred Embodiment 2

A second preferred embodiment of the present invention is described below.

The structure differs from that in Preferred Embodiment 1 in that a fan 13 is located on the side of the lifter component 8 inside the printed circuit board housing apparatus. The embodiment is the same as Preferred Embodiment 1 except for the aforementioned fan 13. The fan 13 is located on the side of the lifter component 8, and is used to cool the interior of the lifter component, so as to cool the printed circuit boards. This preferred embodiment cools the printed circuit boards, so as to allow deformation of the side plates supporting the printed circuit boards inside the rack from becoming deformed, and thereby prevent the printed circuit boards from falling off or becoming stuck.

What is claimed is:

1. A printed circuit board housing apparatus, equipped with a rack having a pair of side plates with concave components to support printed circuit boards, a lifter component that fixes said rack to lift it at a set pitch so as to house printed circuit boards in the rack, and ascending and descending conveyor components for conveying said rack in a set direction, wherein said printed circuit board housing apparatus comprises:

a display mark on the exterior component of said rack side plates for displaying the state of the printed circuit boards inside the rack, and a shutter for switching the display of said display mark; and a drive component for sliding said shutter to the top of the bottom conveyor.

2. A printed circuit board housing apparatus as defined in claim 1, wherein the drive component further comprises a pair each of cylinders and levers, said shutter being operated via the levers by the operation of the cylinders.

3. A printed circuit board housing apparatus as defined in claim 1, further comprising a spring for positioning the shutter, and a guide to prevent the shutter from jumping out.

4. A printed circuit board housing apparatus as defined in claim 1, further comprising a fan at the lifter component for cooling the interior of the lifter component and for cooling the printed circuit boards.

* * * * *